United States Patent
Bohr et al.

(10) Patent No.: US 7,208,830 B2
(45) Date of Patent: Apr. 24, 2007

(54) INTERCONNECT SHUNT USED FOR CURRENT DISTRIBUTION AND RELIABILITY REDUNDANCY

(75) Inventors: Mark Bohr, Aloha, OR (US); Jun He, Portland, OR (US); Fay Hua, San Jose, CA (US); Dustin P. Wood, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 10/883,419

(22) Filed: Jun. 30, 2004

(65) Prior Publication Data

US 2006/0001178 A1    Jan. 5, 2006

(51) Int. Cl.
*H01L 23/48* (2006.01)

(52) U.S. Cl. ............... 257/690; 257/778; 257/E23.001

(58) Field of Classification Search ............... 257/737, 257/738, 779, 780, 781, 665, 690; 228/179.1, 228/180.21, 180.22; 438/108
See application file for complete search history.

(56) References Cited

U.S. PATENT DOCUMENTS

| | | | |
|---|---|---|---|
| 5,255,839 A * | 10/1993 | da Costa Alves et al. | 228/180.21 |
| 5,741,729 A * | 4/1998 | Selna | 438/125 |
| 6,501,185 B1 * | 12/2002 | Chow et al. | 257/780 |
| 6,891,266 B2 * | 5/2005 | Kinayman et al. | 257/724 |

\* cited by examiner

*Primary Examiner*—Thao X. Le
*Assistant Examiner*—Mursalin B. Hafiz
(74) *Attorney, Agent, or Firm*—Blakely, Sokoloff, Taylor & Zafman LLP

(57) ABSTRACT

In one embodiment of the invention, an integrated circuit package includes an integrated circuit, a package substrate, a first bump, a second bump and a shunt to provide for current distribution and reliability redundancy. The first and second bumps provide a first and second electric current pathway between the integrated circuit and package substrate. The shunt provides a third electric current pathway between the first bump and the second bump.

15 Claims, 7 Drawing Sheets

500

510

Form a Shunt between one or more Metal Connection Bumps using a Mask having a Merged Structure

520

Form a Package Solder using a Screen Pattern having a Merged Structure

530

Join the Integrated Circuit to Package Substrate

Figure 5

INTERCONNECT SHUNT USED FOR CURRENT DISTRIBUTION AND RELIABILITY REDUNDANCY

TECHNICAL FIELD

Embodiments of the invention relate to the field of integrated circuit packaging; and more specifically, to the power delivery system for an integrated circuit.

BACKGROUND

Conventional integrated circuit packages include an integrated circuit that is connected to a package substrate via numerous metal connection bumps. The metal connection bumps typically provide a pathway for electronic signals and power carried between an integrated circuit (e.g., a semiconductor die) and a package substrate.

A conductive solder material is used to connect the integrated circuit having metal connection bumps to the package substrate. During circuit operation, and over time, a conductive package solder may be displaced by high electron current density (known as electromigration), causing a fatal disruption in the electric current flow between the integrated circuit and the package substrate.

BRIEF DESCRIPTION OF THE DRAWINGS

The invention may best be understood by referring to the following description and accompanying drawings that are used to illustrate embodiments of the invention. In the drawings:

FIG. 5 illustrates one embodiment of an integrated circuit package manufacturing process flow for manufacturing the integrated circuit package;

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
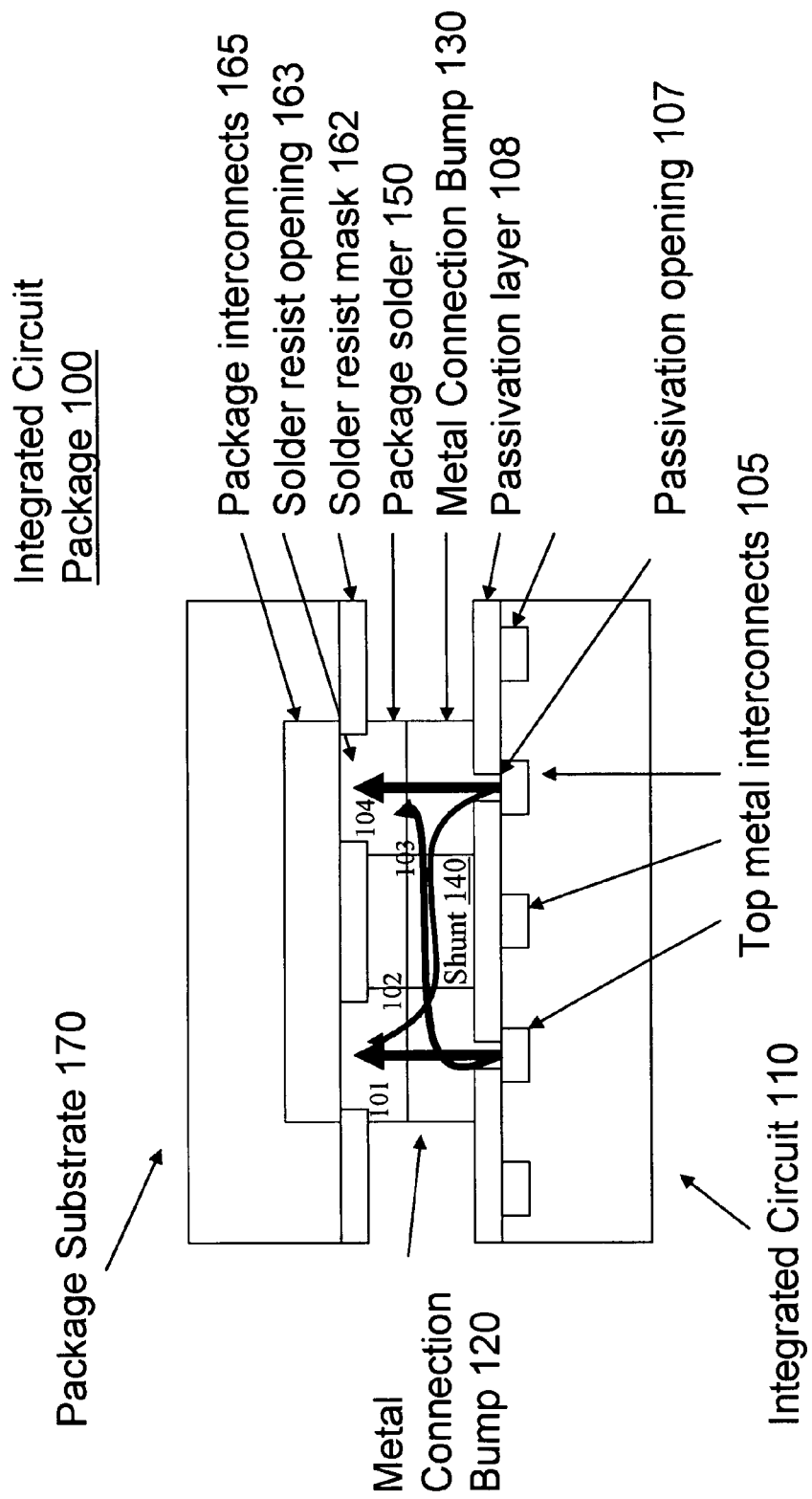
FIG. 1 illustrates one embodiment of a cross-sectional view of an integrated circuit package.

A metal connection bump shunt used for current distribution and reliability redundancy is described. FIG. 1 illustrates one embodiment of a cross-sectional view of an integrated circuit package 100. The integrated circuit package 100 includes an integrated circuit 110, a passivation layer 108, a metal connection bump 120, a metal connection bump 130, a shunt 140, a package solder 150, a solder resist mask 162, and a package substrate 170.

The integrated circuit 110 includes a top plane of metal interconnectors (105) that forms an electric contact to the connection bump 120 and the metal connection bump 130. Examples of the integrated circuit 110 may include a flip-chip semiconductor die as well as others chips well known to those of ordinary skill in the art.

The metal connection bump 120 and metal connection bump 130 are made up of a conductive material that provides an electronic current pathway between the integrated circuit 110 and the package substrate 170. The conductive material may include a copper (cu) alloy, a tin alloy, a lead-tin (PbSn) alloy, among other conductive materials well known to those of ordinary skill in the art. It is understood that the metal connection bump 120 and the metal connection bump 130 may both be part of an array of metal/solder connection bumps that connect the integrated circuit 110 and the package substrate 170. For example, in one embodiment, each metal connection bump in an array of metal connection bumps may be approximately 20–80 microns in height and separated by each other by approximately 50–150 microns.

The shunt 140 provides a lateral electric current pathway between the metal connection bump 120 and the metal connection bump 130, as will be further described below. The shunt 140 may comprise the same material as the metal connection bump 120 and metal connection bump 130. Furthermore, the shunt 140 may also provide an electric current pathway between the integrated circuit 110 and the package substrate 170 as will be described.

The package solder 150 couples the metal connection bump 120, the metal connection bump 130, and/or the shunt 140 to the package substrate 170. The package solder 150 may include a conductive material, such as a lead-tin alloy, a tin-copper alloy among other examples of conductive materials used as a solder well known to those of ordinary skill in the art.

The passivation layer 108 allows the flow of the electric current from the top metal interconnects 105 through the passivation openings 107 to the metal connection bumps (120, 130). In one embodiment, the passivation layer 108 is formed of one or more insulating layers, typically made of silicon nitride, silicon dioxide, and/or polyimide among examples of other insulating materials well known to those of ordinary skill in the art. The solder resist mask 162 allows the flow of the electric current from the integrated circuit 110 through the solder resist openings 163 to the package substrate plane of metal interconnects 165. In one embodiment, the solder resist mask 162 is an insulating layer typically made of a photoimageable epoxy-acrylate material among examples of other insulating materials well known to those of ordinary skill in the art.

The package substrate 170 includes metal interconnects 165 that provides a pathway for electronic signals and current to the integrated circuit 110. In one embodiment, the package substrate 170 is coupled to a circuit broad (e.g., a computer motherboard) that provides pathways to additional integrated circuits, memory components, and power supplies among other components well known to those of ordinary skill in the art.

Arrow 101, Arrow 102, Arrow 103 and Arrow 104 illustrate an example of the flow of the electric current by way of the integrated circuit 110 to the package substrate 170. However, one of ordinary skill in the art will recognize that the electric current might also flow in the direction from the package substrate 170 to the integrated circuit 110.

Figure 2:
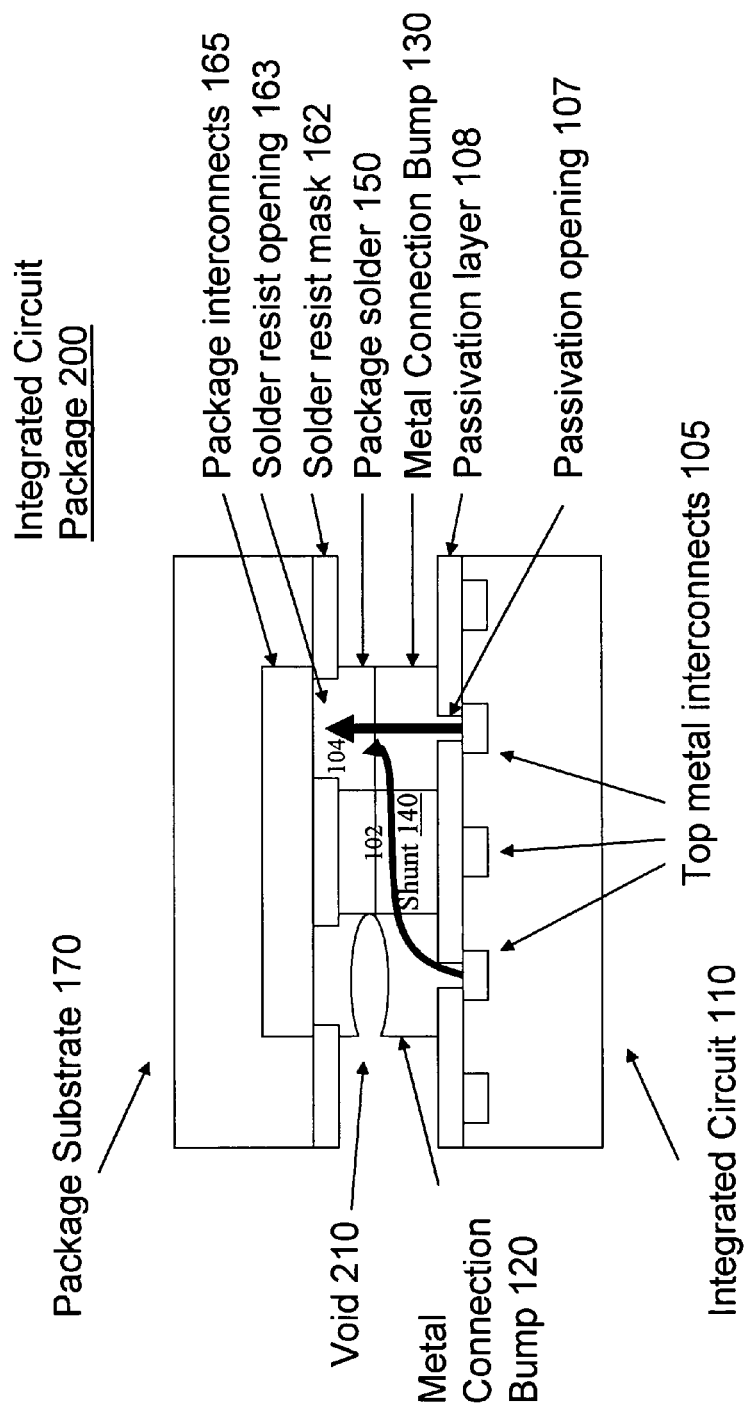
FIG. 2 illustrates one embodiment of an integrated circuit having a connection failure.

FIG. 2 illustrates one embodiment of an integrated circuit 200 having a connection failure. Integrated circuit 200 has the elements as illustrated in FIG. 1 and illustrates a void 210. The void 210 illustrates a connection failure that has occurred between the metal connection bump 120 and the package substrate 170. For example, the connection failure may have occurred due to electromigration at the solder, metal fatigue, metal imperfections, process defects, or anomalies, among other causes of a connection failure well known to those of ordinary skill in the art.

FIG. 2 also illustrates the redistribution of the electric current through the shunt 140 and the metal connection bump 130 via Arrows 102, and 104. In this way, electric current continues to flow between the package substrate 170 and the integrated circuit 110 without disruption caused by a connection failure. Connection failures, such as those caused by electromigration, causes the electric current pathway to open and potentially cause an entire integrated circuit package to fail. The redistribution of the electric current through the shunt 140 allows the electric current pathway to remain close and cause the integrated circuit package to provide a current longer than it otherwise would.

Figure 3:
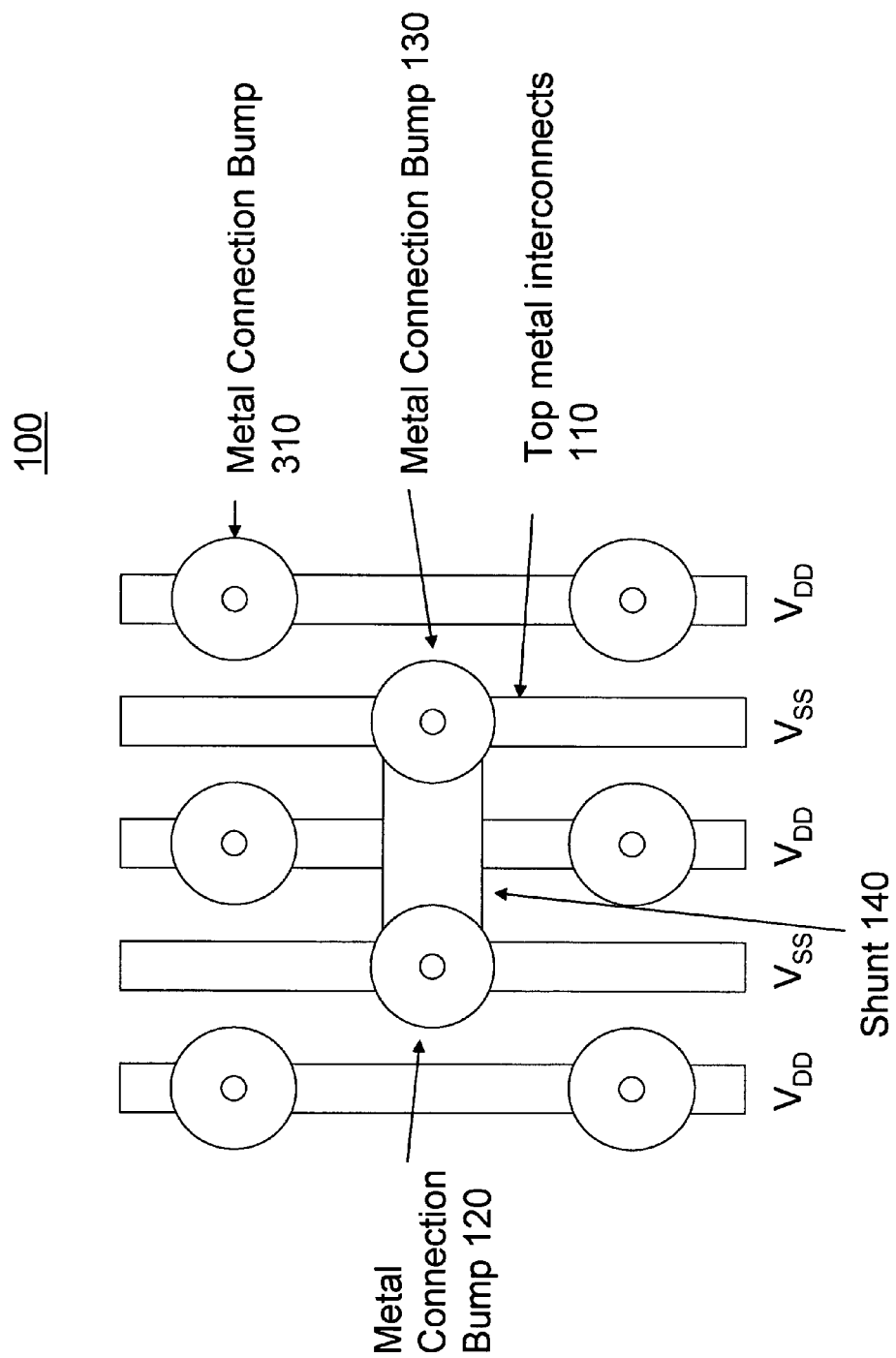
FIG. 3 illustrates one embodiment of a top down view of the integrated circuit package without the package substrate.
Figure 4:
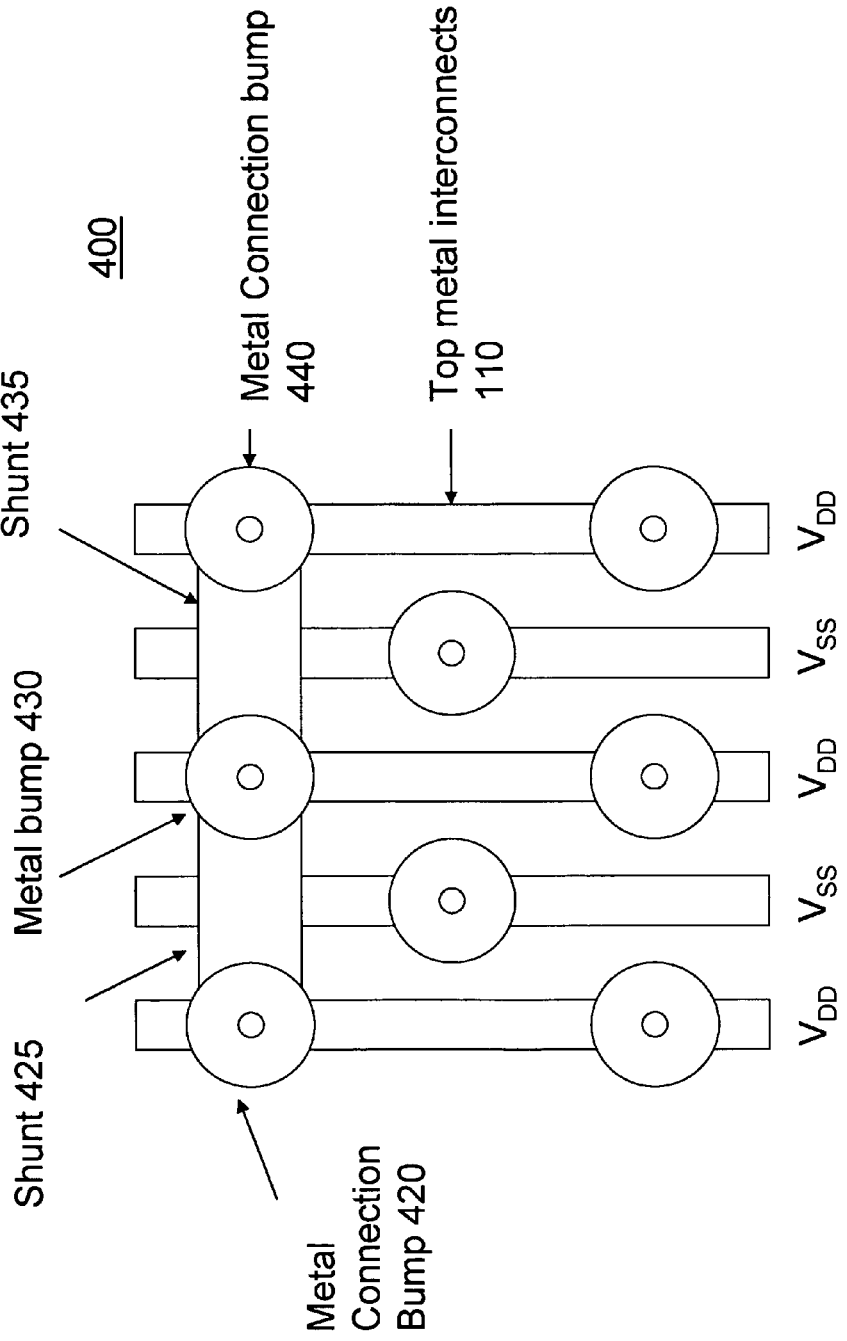
FIG. 4 illustrates a top view of the connection of three metal connection bumps using two shunts.

FIG. 3 illustrates one embodiment of a top down view of the integrated circuit package 100 without the package substrate 170. FIG. 3 illustrates the shunt 140 connecting the metal connection bump 120 and the metal connection bump 130. It is understood that the invention is not limited to connecting two metal connection bumps with one shunt. Rather, in alternative embodiments, multiple shunts may be used to connect multiple metal connection bumps. For example, FIG. 4 illustrates a top view of the integrated circuit 400 connection of three metal connection bumps (420, 430, 440) using two shunts (425, 435).

FIG. 5 illustrates one embodiment of an integrated circuit package manufacturing process flow 500 for manufacturing the integrated circuit package described herein. At block 510, a shunt structure is formed between two or more metal connection bumps using a mask pattern having a merged structure during the preparation of an array of metal connection bumps onto the surface of an integrated circuit. For example, an array of metal connection bumps may be formed for an integrated circuit by electroplating a metal (e.g., copper, lead-tin, etc) with a photoresist mask in place. After plating, the photoresist layer is cleaned off and a thin conducting metal layer that was underneath the photoresist is also stripped off, leaving separate metal connection bumps across the surface that are attached to the integrated circuit top plane of metal interconnects. Thus, a shunt is formed between two or more bumps by using a mask pattern having a merged structure that plates the shunt material at the same time as the bump material.

At block 520, the package solder on the package substrate is formed using a screen pattern having a merged solder structure. For example, a package solder layer may be applied to the bottom of the package substrate by use of common screen printing techniques well known to those of ordinary skill in the art. In one embodiment, the package solder is squeezed through patterns on the screen to leave patterned solder bumps on the package substrate. Solder shunts may then be formed between two or more solder bumps by simply changing the pattern shape on the screen.

At block 530, the array of metal connection bumps on the integrated circuit including the merged metal connection bumps are joined to the package substrate using techniques well known to those of ordinary skill in the art. For example, the integrated circuit may be joined to the package substrate by pressing the two parts together under an elevated temperature. The package solder melts and bonds the integrated circuit to the package substrate. These metal and/or solder shunts now form an electrical connection between the metal bump connections between the integrated circuit and the package substrate.

Figure 7:
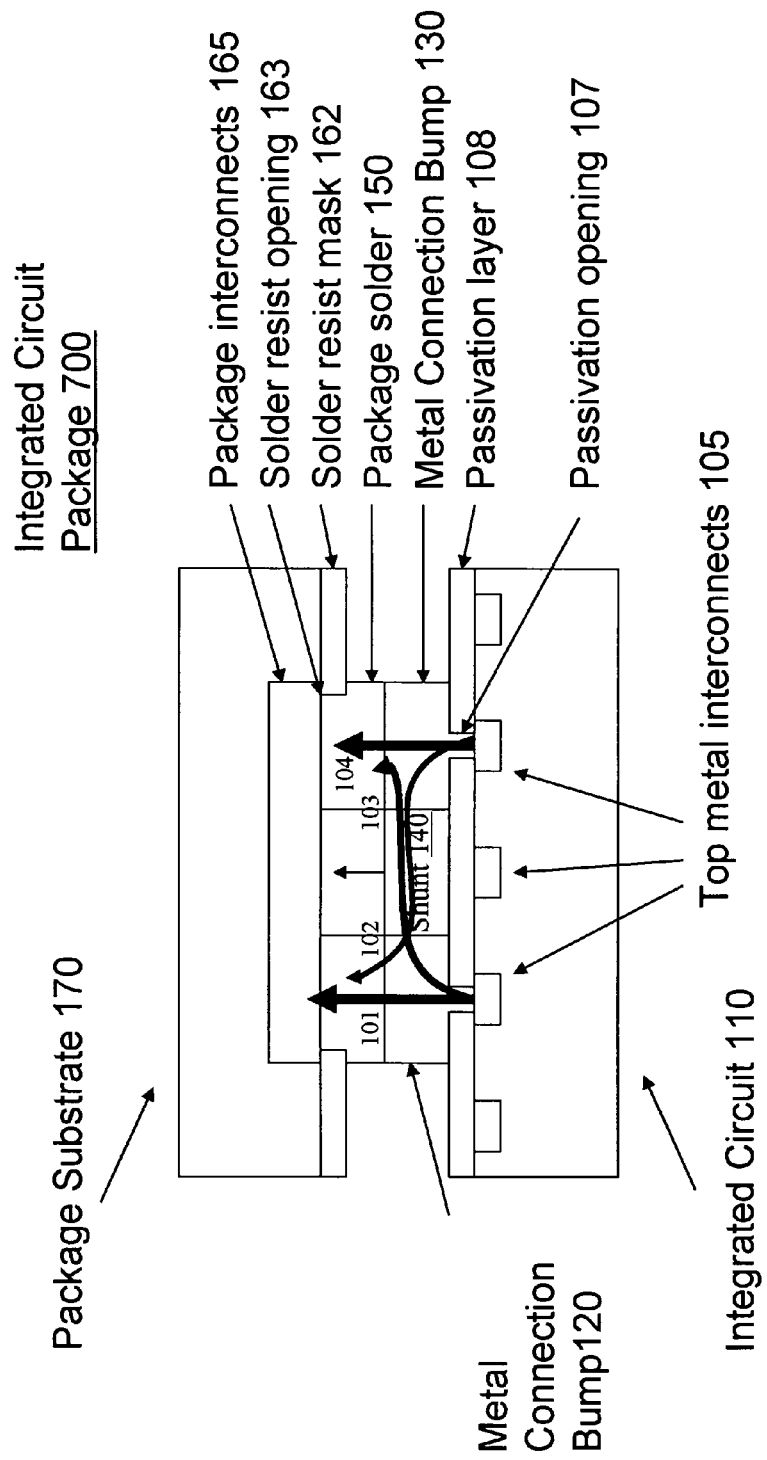
FIG. 7 illustrates an alternative embodiment of an integrated circuit package.

It is understood that the invention is not limited to shunt manufacturing process flow, as described. Rather, alternative embodiments of manufacturing the shunt might be used such as connecting the shunt to each metal connection bump after they are connected to the integrated circuit. In one embodiment, if the metal connection bumps require reflow after deposition, a matched wettable surface may be used to maintain a rectangular shape of the melting solder material to be consistent with the merged shunt structure after the manufacturing process. This is typically achieved by making one or more solder resist openings the size of the package interconnects as illustrated in FIG. 7. This will limit the direction of the package interconnects at package substrate 170.

Figure 6:
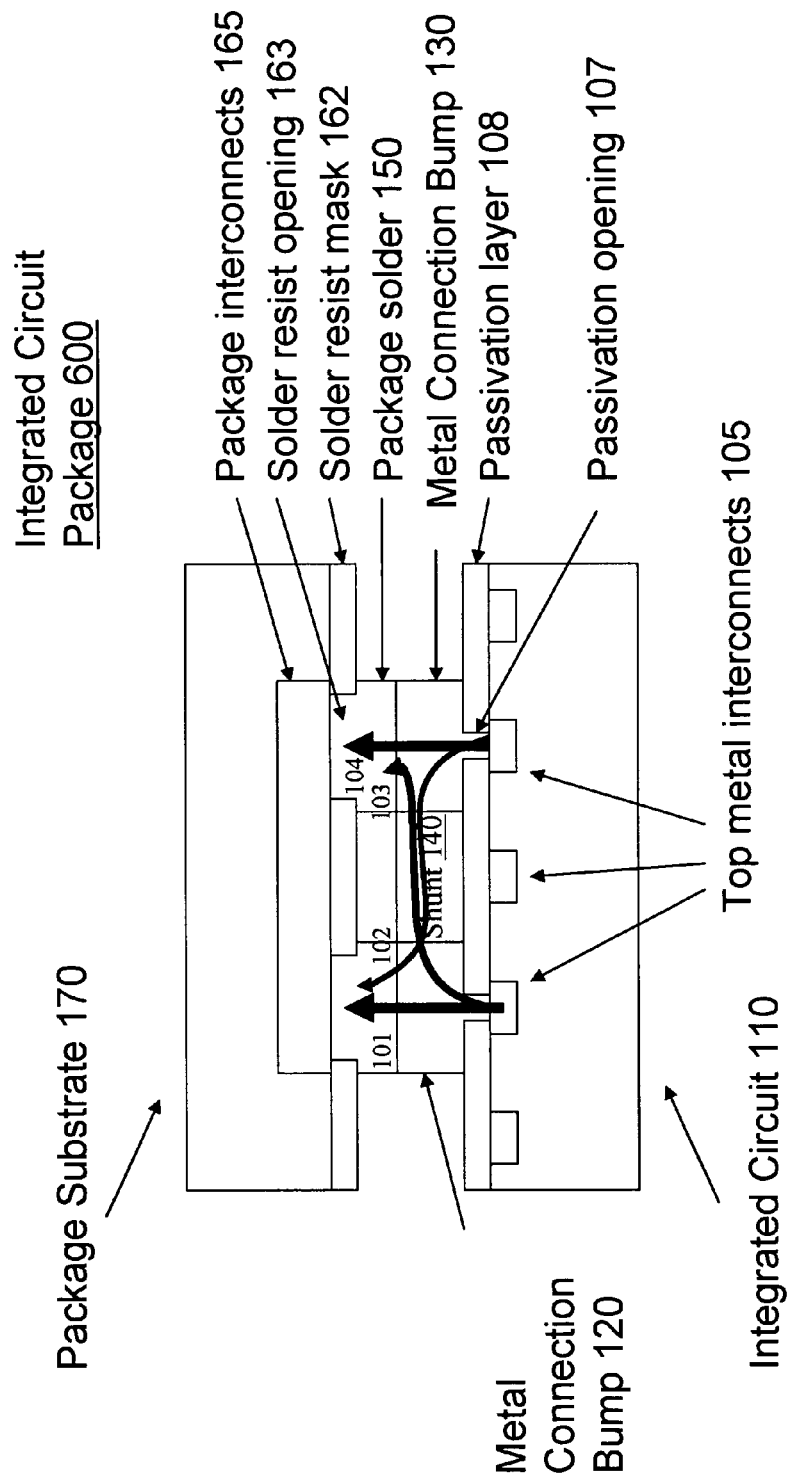
FIG. 6 illustrates an alternative embodiment of an integrated circuit package.

FIGS. 6 and 7 illustrate alternative embodiments of the integrated circuit package having a shunt as described above. Referring to FIG. 6, the integrated circuit package 600 has the same elements as described with FIG. 1, however, the shunt 140 does not include a solder bridge that might carry an electric current from the shunt 140. Referring to FIG. 7, the integrated circuit package 700 has the same elements as described with FIG. 1, however, the solder resist opening 163 is continuous to allow the electric current to flow across the entire package solder 150 to the package substrate 170.

It is understood that the conductive metal connection bump shunt may be used with any array of interconnects to provide an electric current or signal from one plane to another plane such as a first level interconnect connecting a package substrate to an integrated circuit; or a second level interconnect connecting a package substrate to a circuit board, among other examples well known to those of ordinary skill in the art. Also, the invention is not limited to the conductive solder material being placed on the package substrate side, of the integrated circuit package. Rather, in alternative embodiments, the conductive solder material might also be placed on the integrated circuit side of the package.

It should be understood that the integrated circuit package 110 as described herein may be used within numerous computing devices well known to those of ordinary skill in the art including personal computers, servers, handheld devices, set-top boxes, etc.

One of ordinary skill in the art will recognize that the increased cross sectional area of the merged metal connection bump will mitigate the high current density and is compatible with scaling down to smaller bump pitch. Furthermore, the use of the metal connection bump shunt provides a robust alternative current path following, for example, a connection failure with no impact of power delivery and takes full advantage of local current gradient between adjacent metal connection bumps to reduce the 'hot spot' by current redistribution through the shunt. In this manner, the metal connection bump shunt acts as a local distribution layer for interconnect current during normal use conditions as well as a current shunt following an connection failure (e.g., EM failure) anywhere within the merged metal connection bump structure.

While the invention has been described in terms of several embodiments, those skilled in the art will recognize that the invention is not limited to the embodiments described. The method and apparatus of the invention can be practiced with modification and alteration within the spirit and scope of the appended claims. The description is thus to be regarded as illustrative instead of limiting on the invention.

What is claimed is:

1. An integrated circuit package comprising:
   an integrated circuit;
   a package substrate;
   a first bump coupled to the integrated circuit and the package substrate, the first bump to provide a first electric current pathway between the integrated circuit and the package substrate;
   a second bump coupled to the integrated circuit and the package substrate, the second bump to provide a second electric current pathway between the integrated circuit and the package substrate; and
   a first shunt formed between the first bump and the second bump, the first shunt to provide a third electric current pathway between the first bump and the second bump, the first shunt, the first bump, and the second bump substantially in the same plane.

2. The integrated circuit package of claim 1, wherein the first shunt to provide a fourth electric current pathway between the integrated circuit and the package substrate.

3. The integrated circuit package of claim 1 further comprising:
   a third bump coupled to the integrated circuit, the third bump to provide a fifth electric current pathway between the integrated circuit and the package substrate; and
   a second shunt coupled to the second bump and the third bump, the second shunt to provide a fifth electric current pathway between the second bump and the third bump.

4. The integrated circuit package of claim 1 wherein the integrated circuit is a semiconductor flip-chip die.

5. The integrated circuit package of claim 1, wherein the first bump and the second bump are coupled to the package substrate using a package solder.

6. The integrated circuit package of claim 5, wherein the package solder is a lead tin solder.

7. The integrated circuit package of claim 5, wherein the package solder is a tin copper solder.

8. The integrated circuit package of claim 5, wherein the package solder to provide a fourth electric pathway between the shunt and the package substrate.

9. The integrated circuit package of claim 1, wherein the bumps are of a conductive material.

10. The integrated circuit package of claim 9, wherein the conductive material is a copper alloy.

11. The integrated circuit package of claim 9, wherein the conductive material is a lead-tin alloy.

12. The integrated circuit package of claim 1, wherein the bumps are of an array of bumps.

13. An integrated circuit package comprising:
    an integrated circuit;
    a package substrate;
    a first means for interconnecting the integrated circuit and the package substrate;
    a second means for interconnecting the integrated circuit and the package substrate; and
    means for providing an electric current pathway between the first means for interconnecting and the second means for interconnecting, the means for providing electric current pathway, the first means for interconnecting, and the second means for interconnecting substantially in the same plane.

14. The integrated circuit of claim 13, wherein the means for providing an electric current pathway between the first means for interconnecting and the second means for interconnecting further includes a means for providing an electric current pathway between the package substrate and the integrated circuit.

15. The integrated circuit package of claim 13 further comprising:
    a means for connecting the package substrate to the first and second means for interconnecting the integrated circuit to the package substrate.

* * * * *